(12) United States Patent
Moto

(10) Patent No.: US 7,457,333 B2
(45) Date of Patent: Nov. 25, 2008

(54) LIGHT-TRANSMITTING MODULE CAPABLE OF RESPONDING A HIGH-FREQUENCY OVER 10 GHZ

(75) Inventor: Akihiro Moto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 502 days.

(21) Appl. No.: 10/797,571

(22) Filed: Mar. 11, 2004

(65) Prior Publication Data

US 2004/0233946 A1 Nov. 25, 2004

(30) Foreign Application Priority Data

Mar. 14, 2003 (JP) .............................. 2003-070471

(51) Int. Cl.
*H01S 3/04* (2006.01)
(52) U.S. Cl. ..................................... 372/36; 372/44.01
(58) Field of Classification Search .................. 372/36, 372/34, 43.01, 50.1, 44
See application file for complete search history.

(56) References Cited

U.S. PATENT DOCUMENTS 5,615,224 A * 3/1997 Cohen .......................... 372/36
5,757,027 A * 5/1998 Kuchta ......................... 257/48
6,301,278 B2* 10/2001 Uchida ......................... 372/36
6,633,598 B1* 10/2003 Kimizuka et al. ......... 372/50.21
2003/0044128 A1* 3/2003 Crane et al. .................... 385/92
2005/0265412 A1* 12/2005 Ueki ........................ 372/43.01

FOREIGN PATENT DOCUMENTS

| JP | 4-64243 | 2/1992 |
| JP | 11-103004 | 4/1999 |
| JP | 2001-210841 | 8/2001 |
| JP | 2001-274500 | 10/2001 |

* cited by examiner

*Primary Examiner*—Minsun Harvey
*Assistant Examiner*—Delma R Fordé
(74) *Attorney, Agent, or Firm*—Smith, Gambrell & Russell, LLP

(57) ABSTRACT

The laser diode of the present invention is mounted on the heat sink made of insulating material such as aluminum nitride (AlN). On the heat sink, a metal film, evaporated gold film, is provided and the laser diode is mounted on the heat sink such that the anode electrode of the laser diode faces and is in contact with the metal film. The heat sink is mounted on the grounded metal member, thus the metal member, the heat sink and the metal film forms an capacitor. The bias for the laser diode is provided via the metal film, thereby stabilizing the bias supply even when the operational frequency for the laser diode is over 10 Gbps.

11 Claims, 14 Drawing Sheets

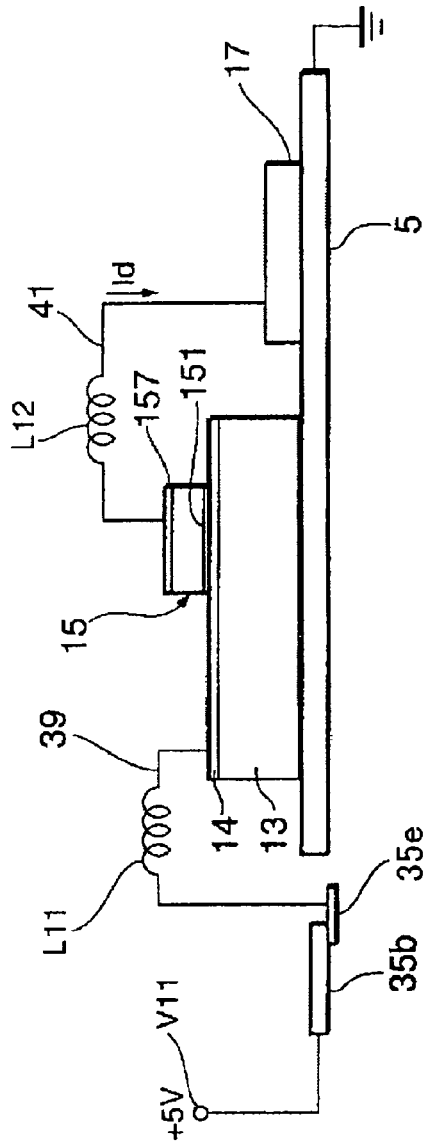
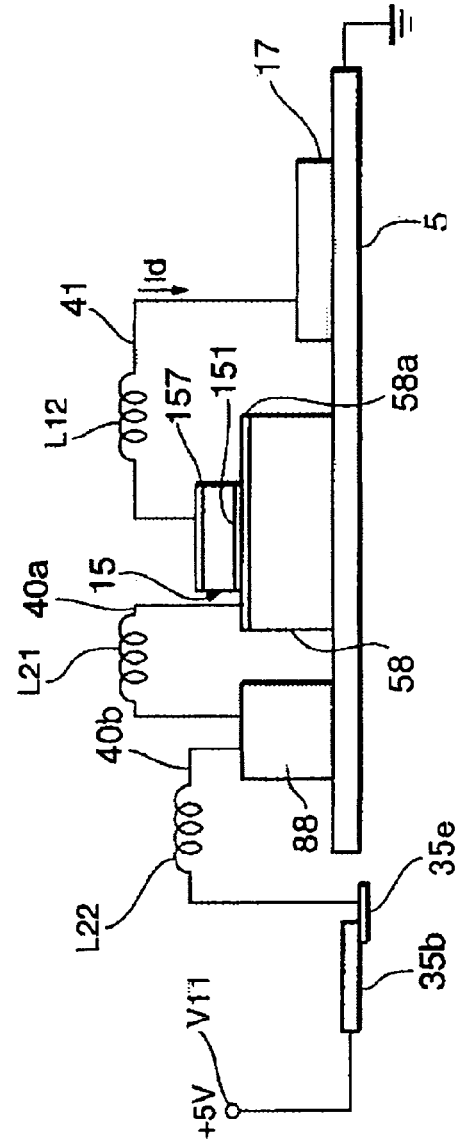
FIG. 8A
FIG. 8B

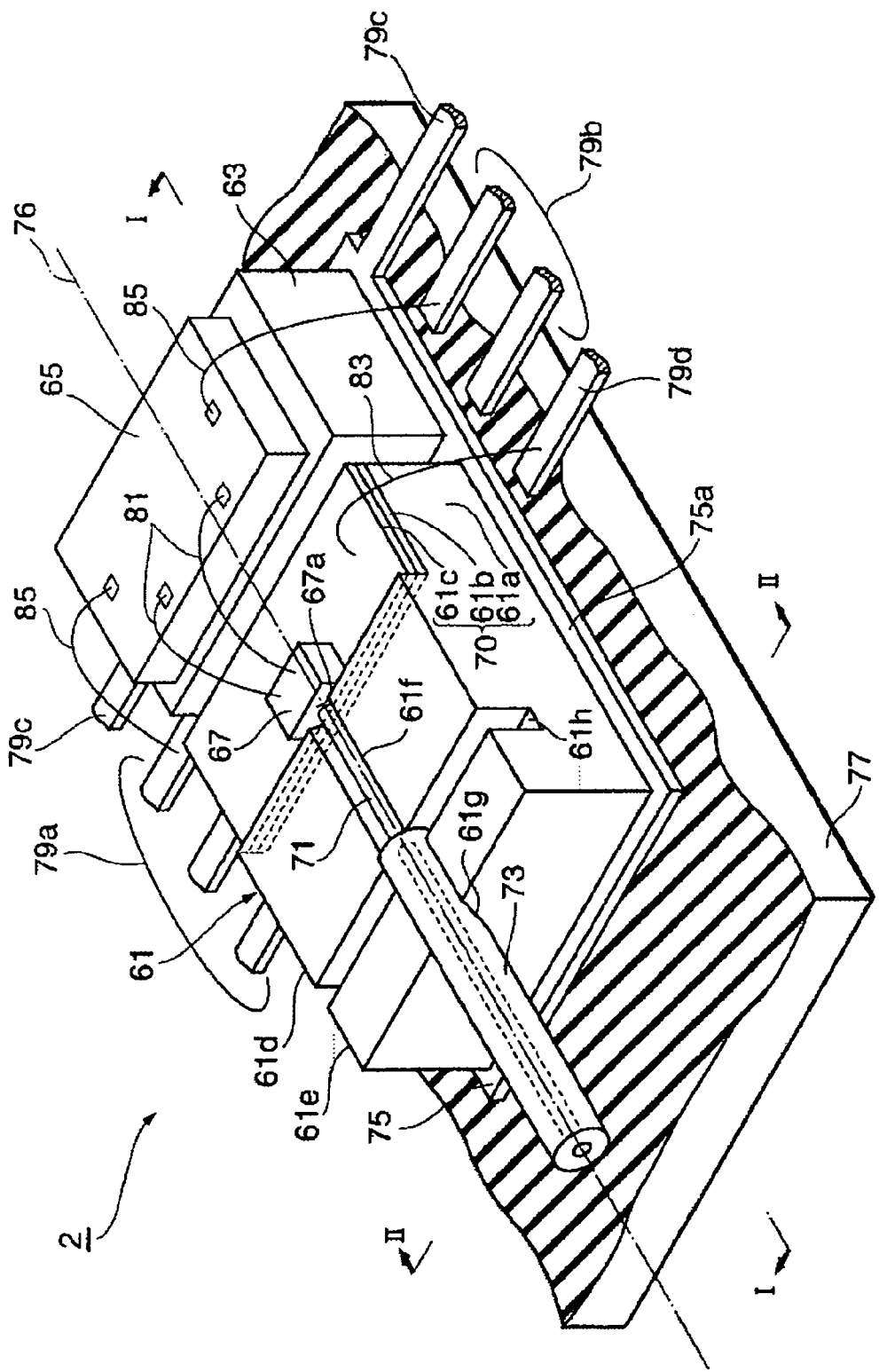

LIGHT-TRANSMITTING MODULE CAPABLE OF RESPONDING A HIGH-FREQUENCY OVER 10 GHZ

BACKGROUND OF THE INVENTION

1. Field of the Invention

This invention relates to a light-transmitting module using a semiconductor laser diode.

2. Related Prior Art

In an optical communication system, a light-transmitting module that includes a laser diode therein is used. The light-emitting module also includes a driver for driving the laser diode, wiring for supplying a bias voltage to the laser diode and a capacitor for stabilizing the bias voltage. These components electrically connecting to each other form a driving circuit.

Recent optical communication requires the transmission speed in extremely high frequencies, for example over 10 Gbps. In general, parasitic inductance and capacitance influence the performance in such high frequencies because the inductance and the capacitance cause a critical frequency. When the critical frequency closes to the transmission frequency, the driving circuit will operate in unstable. Therefore, it is required that the parasitic inductance and capacitance must be reduced as the transmission frequency becomes higher and higher.

An object of the present invention is to provide a light-transmitting module used in a higher transmission frequency, in which the parasitic inductance is eliminated.

SUMMARY OF THE INVENTION

According to one aspect of the present invention, a light-transmitting module comprises a metallic block, an insulating heat sink, an electrically conductive layer, and a laser diode. The heat sink is mounted on the block and the conductive layer is provided on the heat sink so that the metallic block, the insulating heat sink and the conductive layer form a parallel-plate capacitor. The laser diode has an anode and a cathode, and is mounted on the conductive layer such that the anode faces and is in contact with the conductive layer.

The capacitance of the parallel-plate capacitor is preferably at least 50 pF. In the configuration above described, the anode of the laser diode is coupled with the parallel-plate capacitor at immediate side thereof so that a bias applied to the laser diode is stabilized, thereby enhancing a high frequency performance of the laser diode even at an operational frequency over 10 Gbps.

According to another aspect of the present invention, a light-transmitting module comprises an electrically conductive heat sink, an insulating layer, an electrically conductive layer, and a laser diode. The insulating layer is provided on the heat sink, and the conductive layer is provided on the insulating layer, so that the heat sink, the insulating layer and the conductive layer form a parallel plate capacitor. The laser diode has an anode and a cathode, and is mounted on the conductive layer such that the anode faces and is in contact with the conductive layer.

The capacitance of the parallel-plate capacitor is preferably at least 50 pF. Also in this configuration, since the anode of the laser diode is coupled with the parallel-plate capacitor at immediate side thereof so that a bias applied to the laser diode may be stabilized. Therefore, a high frequency performance over 10 bps may be enhanced.

The heat sink may include a V-groove for securing an optical fiber therein. The heat sink may further include another groove for securing an ferrule in which the optical fiber inserted.

The light-transmitting module of the present invention may further include a driver for driving the laser diode. The driver is preferably mounted on the conductive block or the heat sink such that an electrical connection between the driver and the laser diode may shorten, thereby enhancing the high frequency performance of the light-transmitting module.

BRIEF DESCRIPTION OF DRAWINGS

FIG. 8A is a schematic view showing an electrical connection corresponding to the arrangement of FIG. 7A, and FIG. 8B is another electrical connection corresponding to FIG. 7B;

Figure 11:
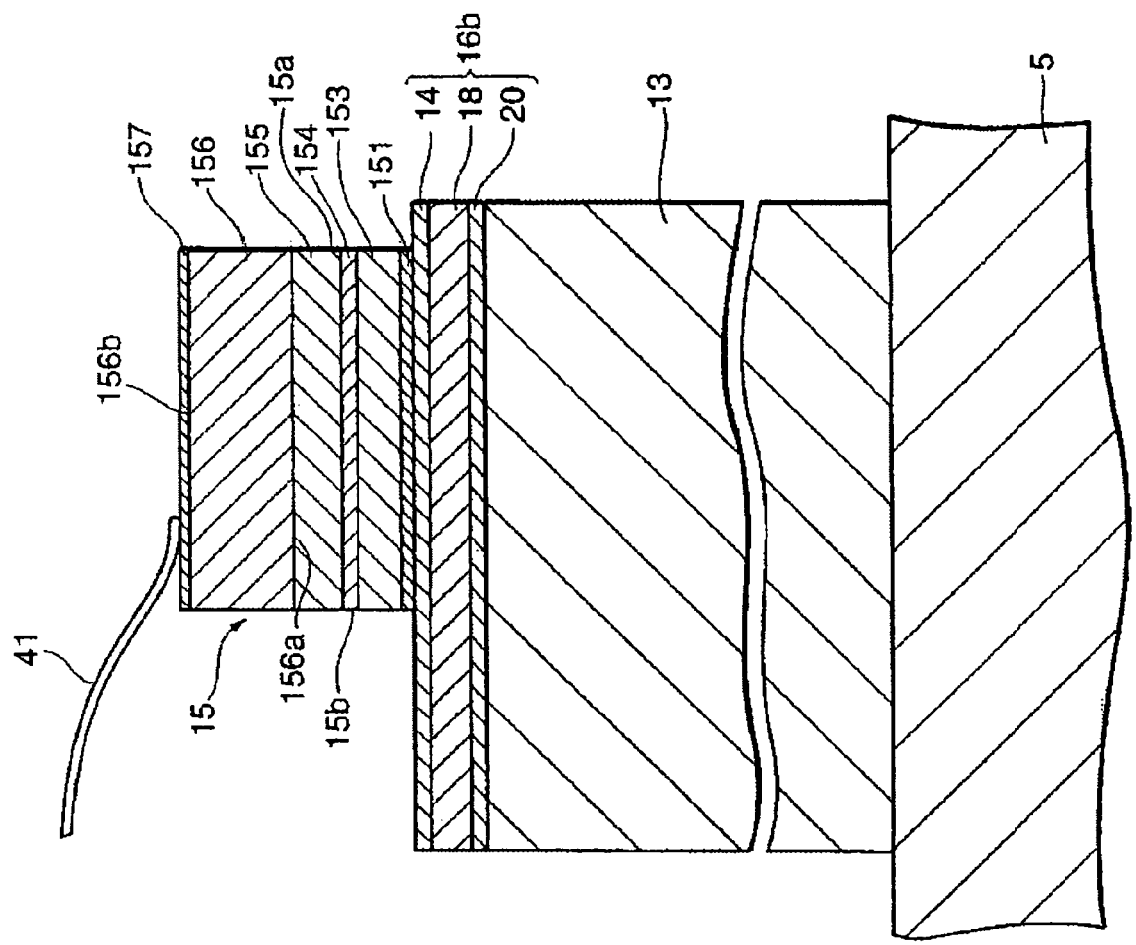
Figure 13A:
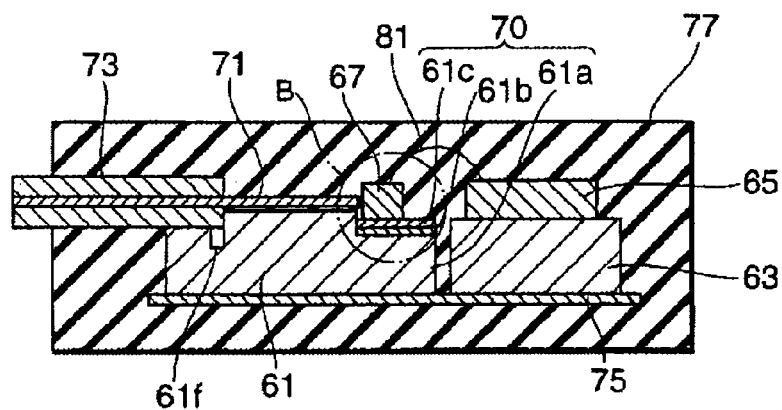
Figure 13B:
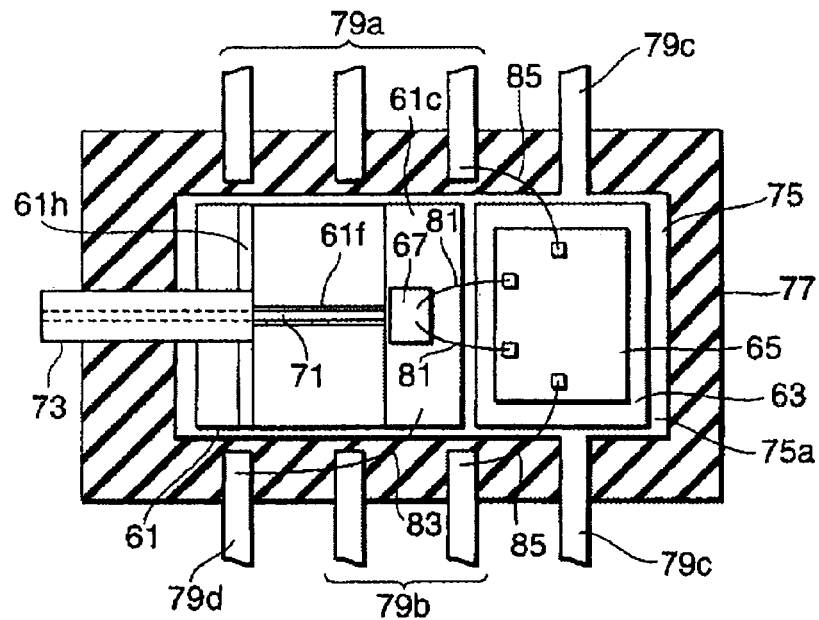
Figure 13C:
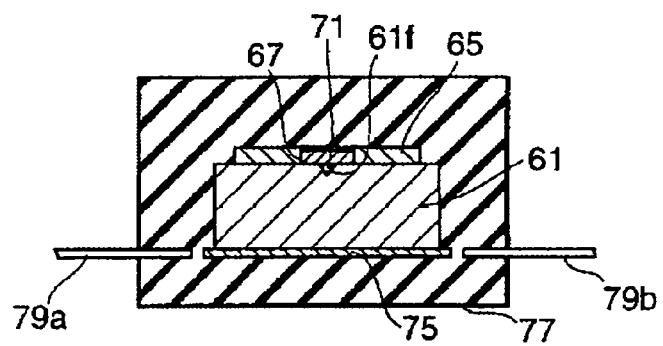
Figure 14:
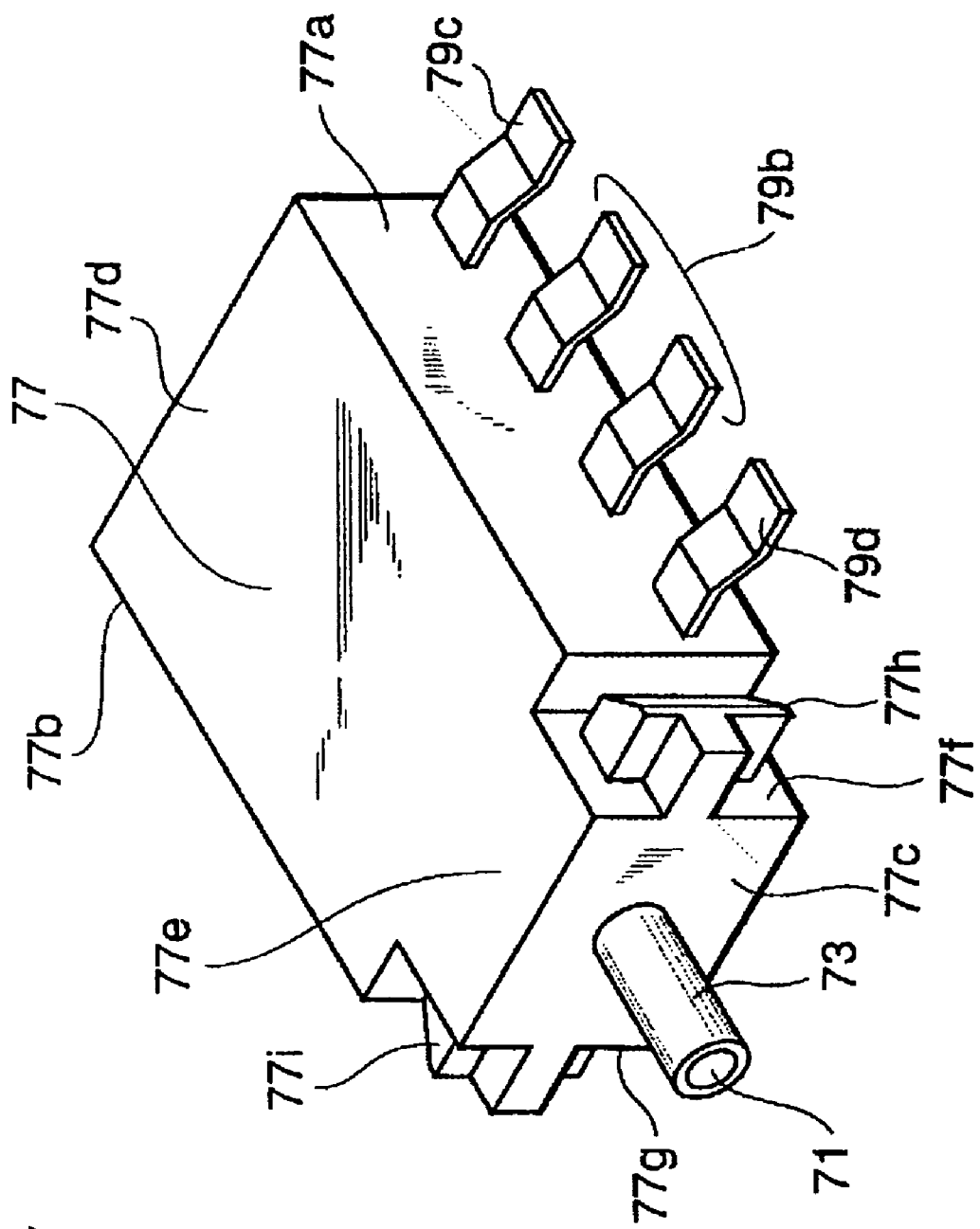

From FIG. 10A to FIG. 10D are frequency response of circuits for driving the laser diode when the capacitance of the capacitor 16 is 1000 pF, 50 pF, 1 pF and 0 pF, respectively;

FIG. 11 is an expanded view of the heat sink and the laser diode thereon according to another modification of the present invention;

FIG. 12 is a light-emitting module according to the second embodiment of the present invention;

FIG. 13A is a cross sectional view taken along the line I-I in FIG. 12, FIG. 13B is a plan view and FIG. 13C is a cross sectional view taken along the line II-II in FIG. 12;

FIG. 14 is an outside appearance of the light-emitting module according to the second embodiment.

DETAILED DESCRIPTION OF PREFERRED EMBODIMENTS

Next, preferred embodiments of the present invention will be described as referring to accompanying drawings. In the drawings, same symbols or numerals without overlapping explanation will refer same elements. In the specification, "front side" corresponds to a direction to which light is to be emitted.

First Embodiment

Figure 1:
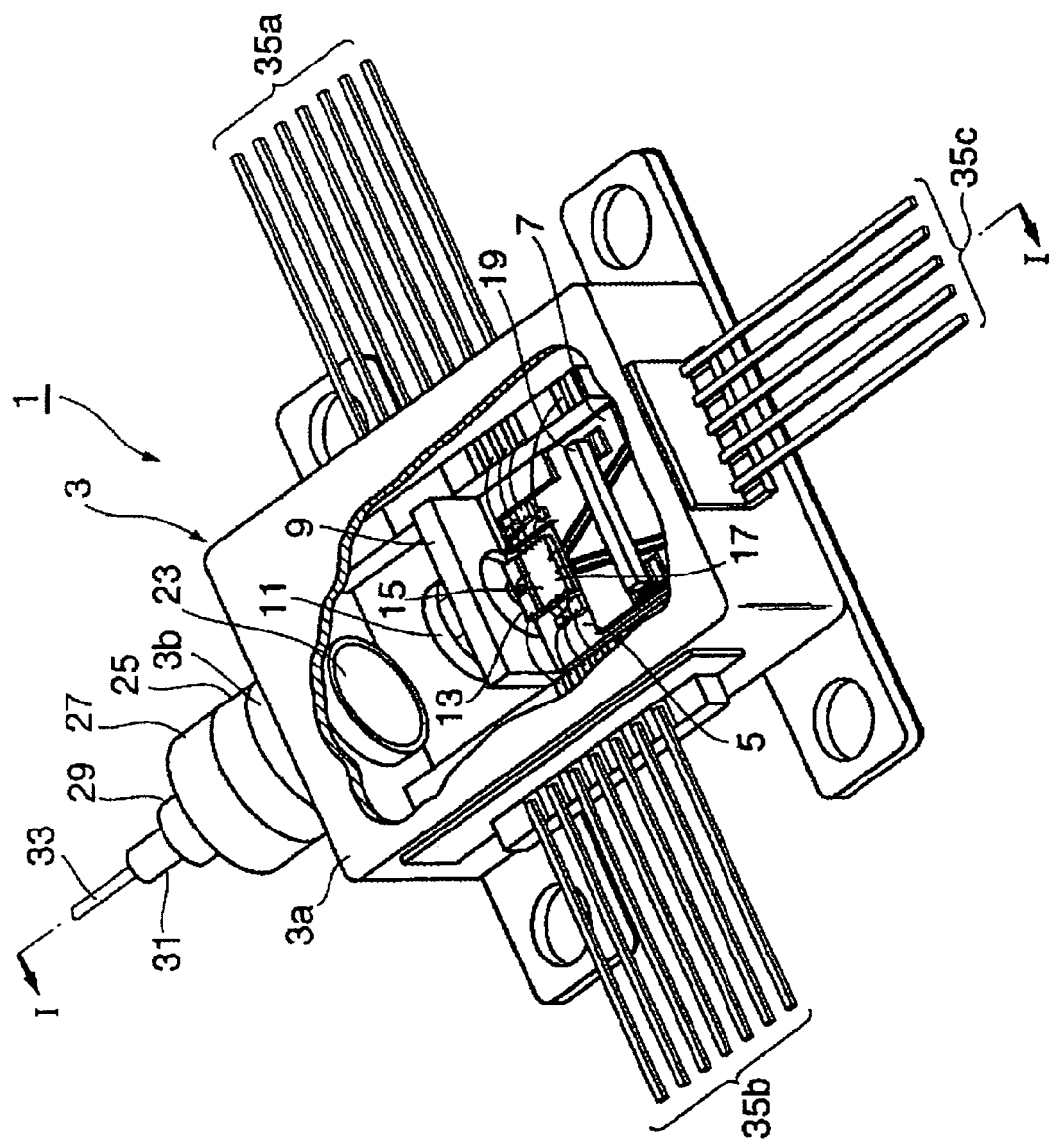
FIG. 1 is a perspective view of the light-emitting module according to the present invention.
Figure 2:
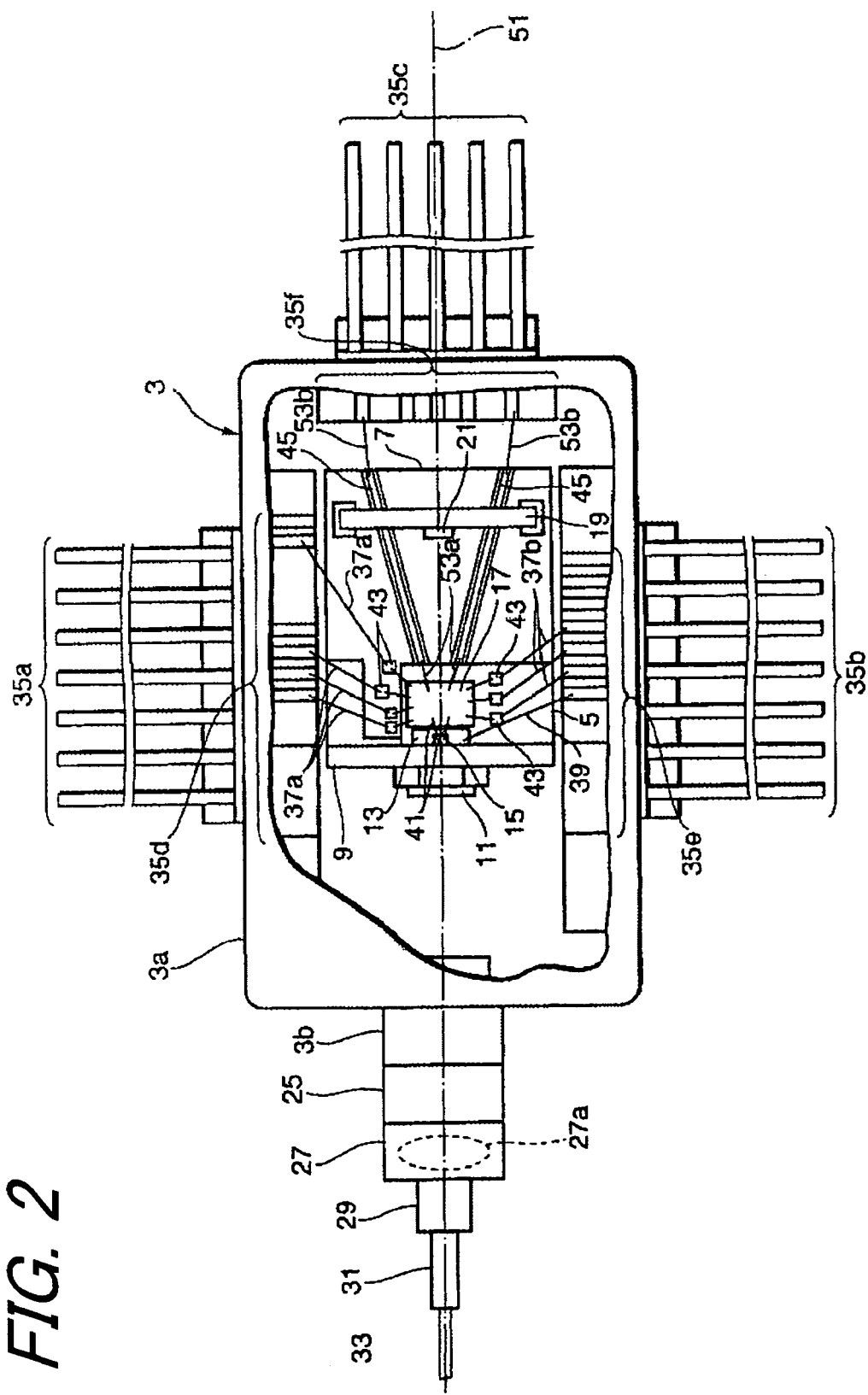
FIG. 2 is a plan view of the module shown in FIG. 1.
Figure 3:
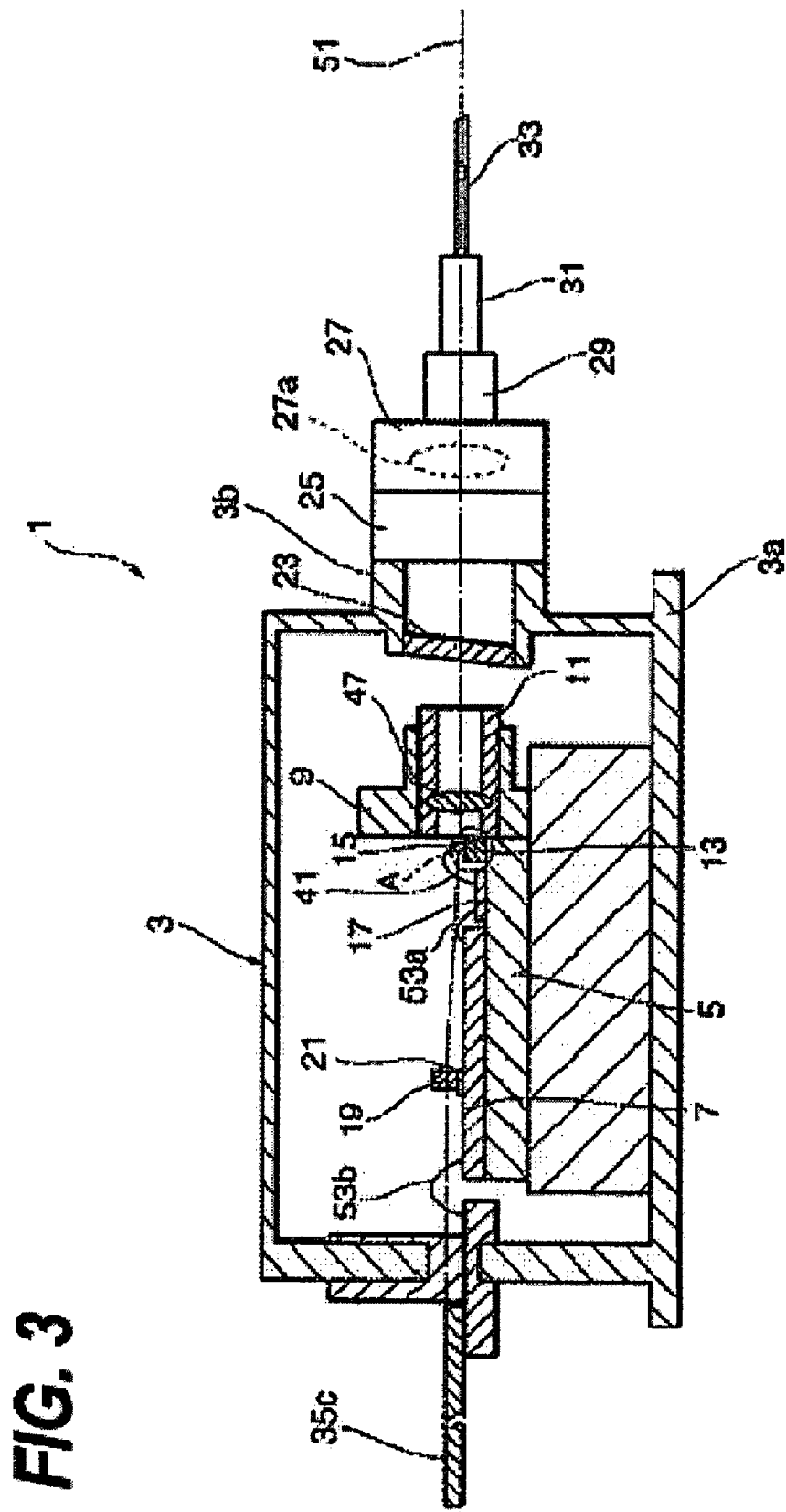
FIG. 3 is a cross sectional view taken along the line I-I in FIG. 1.

From FIG. 1 to FIG. 3 show a light-transmitting module 1 according to the first embodiment of the present invention, FIG. 1 is a perspective view, FIG. 2 is a plan view and FIG. 3 is a cross sectional view along the lint I-I in FIG. 1, respectively.

The light-transmitting module 1 includes a package 3, a first block 5, a substrate 7, a heat sink 13, a laser diode 15 and a driver 17. The package 3, so-called a butterfly type package, has a box portion 3a enclosing the laser diode 15 and the driver 17 and a cylindrical portion 3b provided in the front side of the box portion 3a. Within the box portion 3a, an inert gas such as dry nitrogen is filled.

The first block 5 is a metallic slab disposed on the bottom surface 49 of the box portion 3a. The heat sink 13 and the driver 17, arranged along a reference axis 51 in FIG. 2, are disposed on the first block 5. The heat sink 13 is an insulator such as aluminum nitride (AlN), which dissipates heat generated by the laser diode 15 to the first block 5. Other materials are applicable to the heat sink 13, for example, a titanate of barium (Ba) or lead (Pb), or a niobate of potassium (K), lithium (Li), strontium (Sr) or barium (Ba). The driver 17 drives the laser diode 15 by supplying modulation current and bias current thereto. On the heat sink 13 disposes the laser diode 15 such that a light-emitting facet 15a thereof faces to the front side.

Figure 4:
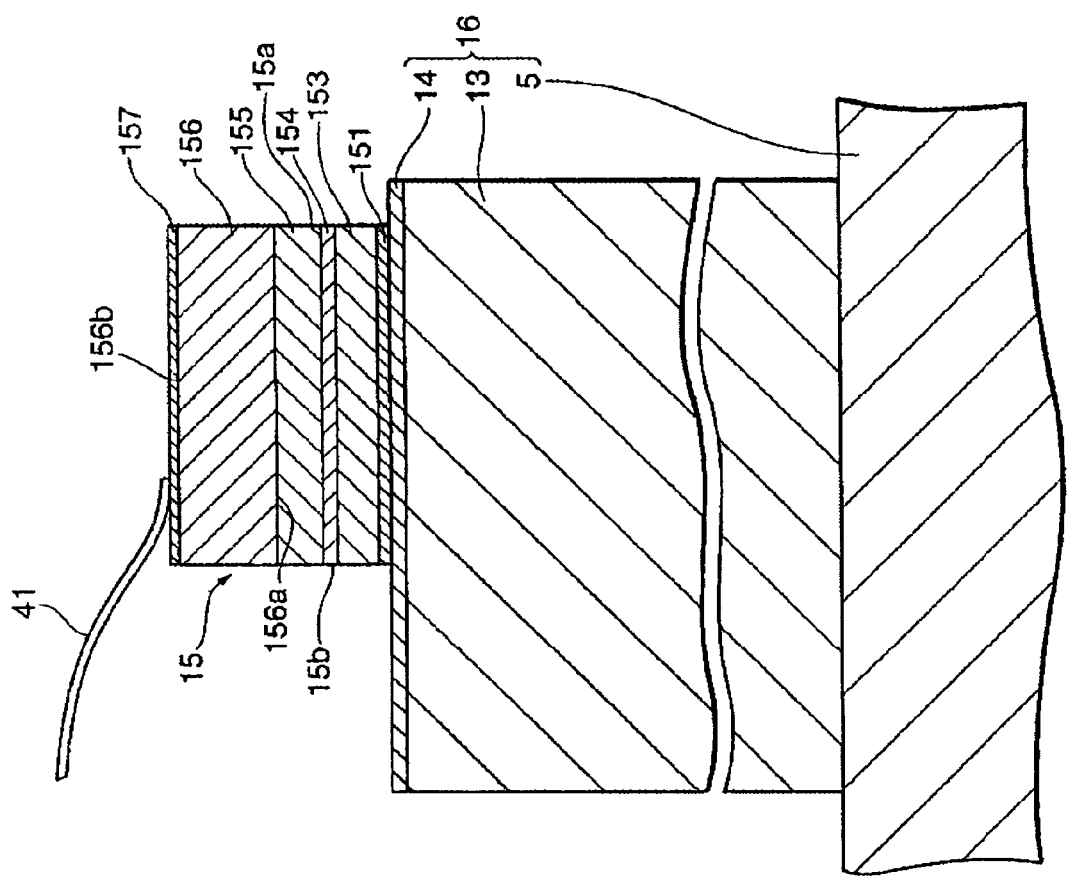
FIG. 4 is an expanded cross sectional view showing the heat sink and the laser diode of FIG. 3.

FIG. 4 expands a portion of the heat sink 13 and the laser diode 15 shown in FIG. 3. The heat sink 13 provides a conductive layer 14 on the top surface thereof, which is a gold (Au) film formed by evaporation. Since the heat sink is insulating, an arrangement of the first block 5, the heat sink 13 and the conductive layer 14 emulate a capacitor 16. The capacitance of the capacitor 16 is preferably greater than 50 pF by taking a resonant frequency of the laser diode 15. The arrangement of FIG. 4, the heat sink 13 and the conductive layer 14 have 0.5 mm square, and a thickness thereof of 0.3 mm, results in capacitance of about 67 pF, where the dielectric constant of aluminumnitride is about 9.1. Accordingly, an effective capacitance can be attained with space enough to dispose the laser diode 15 on the heat sink 13.

A structure of the laser diode 15 will be described herein below. The laser diode 15 has an n-type semiconductor substrate 156. An n-type cladding layer 155, an active layer 154 and a p-type cladding layer 153 are sequentially stacked on a surface 156a of the substrate 156. These layers from 153 to 155 are epitaxially grown on the substrate. Another surface 156b of the substrate 156 provides a cathode electrode 157, while an anode electrode 151 is provided on the p-type cladding layer 153. The laser diode 15 is mounted on the heat sink 13 such that the anode electrode 151 thereof faces and is in contact with the conductive layer 14 of the heat sink 13. This arrangement of the laser diode 15 on the heat sink 13 is called as an epi-down arrangement.

On the other hand, the laser diode 151 may have a p-type substrate 156. On the one surface 156a of the p-type substrate 156 is grown a p-type cladding layer 155, an active layer 154, and an n-type cladding layer 153 in this order. The other surface 156b of the p-type substrate has an anode electrode 157. The cathode electrode 151 is provided on the n-type cladding layer 153. The laser diode 15 is mounted on the conductive layer 14 such that the anode electrode 151 thereof faces and is in contact with the conductive layer 14. This configuration of the mounting of the laser diode is called as an epi-up assembly.

Figure 5:
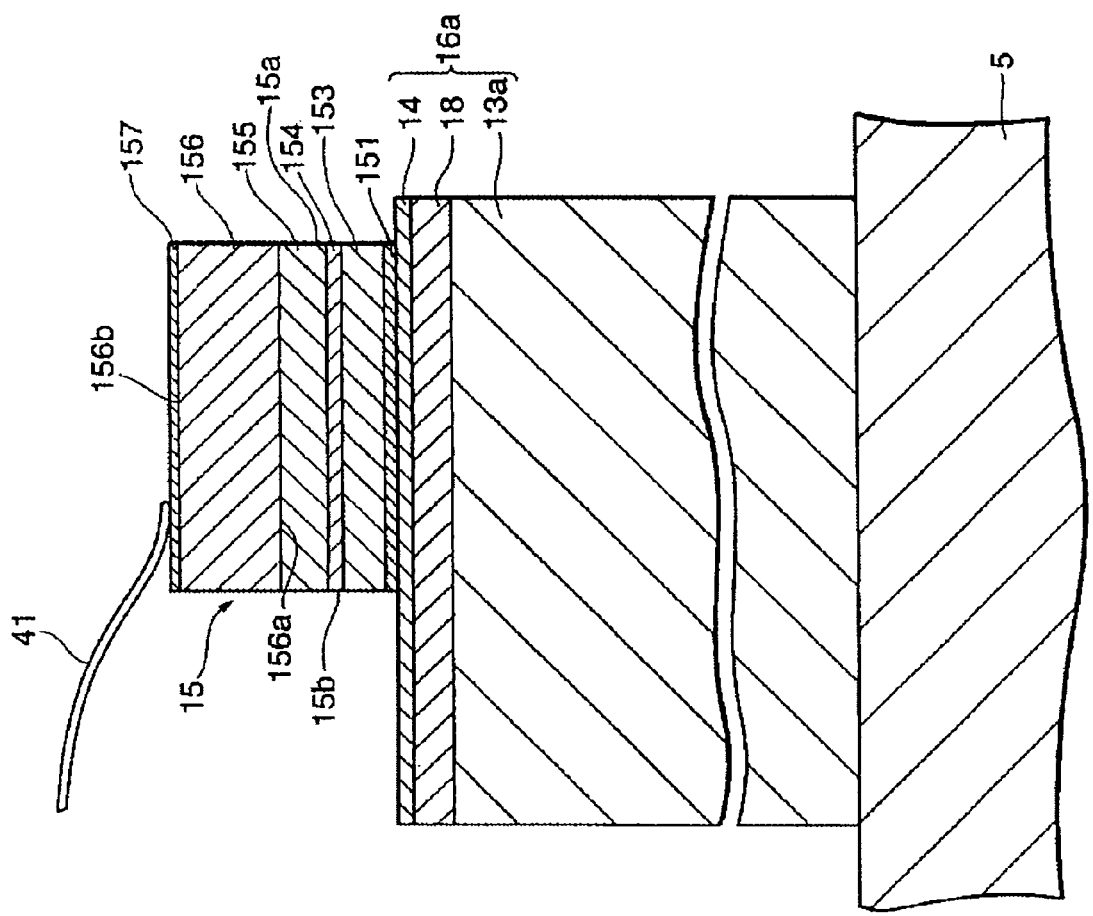
FIG. 5 is another expanded cross sectional view showing the heat sink and the laser diode.

FIG. 5 shows another type of the capacitance. The heat sink 13a shown in FIG. 5 is made of conductive material such as silicon (Si). On the heat sink 13a is provided an insulating layer 18 of, for example a silicon oxide ($SiO_2$), a silicon nitride (SiN) or a silicon oxi-nitride (SiON). Further, a conductive layer 14 is formed on the insulating layer 18. The capacitor 16a is formed by the heat sink 13a, the insulating layer 18 and the conductive layer 14, the capacitance of which is, similar to the capacitor shown in FIG. 4, preferably greater than 50 pF by taking the resonance frequency of the laser diode 15 into account. In the present embodiment, the insulating layer 18 and the conductive layer 14 have 0.5 mm square, and the thickness of the insulating layer is 100 nm, which results on about 80 pF for the capacitance of the capacitor 16a because the dielectric constant of silicon oxide is about 4.

Referring from FIG. 1 to FIG. 3 again, the light-transmitting module 1 further includes a second block 9, a lens holder 11 and a first lens 47 in the box portion 3a. The second 2 block is disposed in front of the first block 5. The second block has an aperture into which the lens holder 11 is inserted. The lens holder 11 secures the first lens 47 for collimating light emitted from the laser diode 15. By sliding the lens holder 11 in the aperture, a length between the first lens 47 and the laser diode 15 can be adjusted.

The light-transmitting module 1 further includes a sub-mount 19 and a photodiode 21 on the substrate 7. The substrate 7 is mounted on the first block 5 and has a shape so as to surround at behind and aside the driver 7. The sub-mount 19 is mounted on the substrate 7 so as to extend along a direction across the reference axis 51. The photodiode 21 is put on the front surface of the sub-mount 19 and optically coupled with a light-reflecting facet 15b opposite to the light-emitting facet 15a.

A plurality of lead terminals from 35a to 35c is disposed at sidewall of the box portion 3a. The lead terminals 35a and the lead terminals 35b are disposed in a pair of sidewall opposite to each other and extending along a direction across the reference axis 51. The lead terminals 35c are disposed rear side wall of the box portion 3a, which extends along the reference axis 51. These lead terminals from 35a to 35c are electrically connected to corresponding wiring patterns from 35d to 35f formed within in the box portion 3a, respectively.

A window sealed with a hermetic glass 23 is formed at a point coupled to the cylindrical portion 3b in the front wall of the box portion 3a. In the cylindrical portion 3b is provided a bore coupled with the box portion 3a via the window. The bore transmits light from the laser diode to an optical fiber 33, which is not shown in the drawings. Further, the cylindrical portion 3b provides another lens holder 27, which secures a second lens 27a, in a tip portion thereof. Between another lens holder 27 and the cylindrical portion 3b can provide an optical isolator 25, which prevents light reflected by the optical fiber 33 from returning to the laser diode 15.

The optical fiber 33, which is protected by a ferrule 31 in the tip thereof, is disposed in the end of the cylindrical portion 3b. The lens holder 27 secures a sleeve 29 that receives the ferrule 31 provided in the tip of the optical fiber 33, thereby enabling optical coupling between the package 3, namely the first and second lenses 47 and 27a, respectively, and the laser diode 15, and the optical fiber 33.

Figure 6:
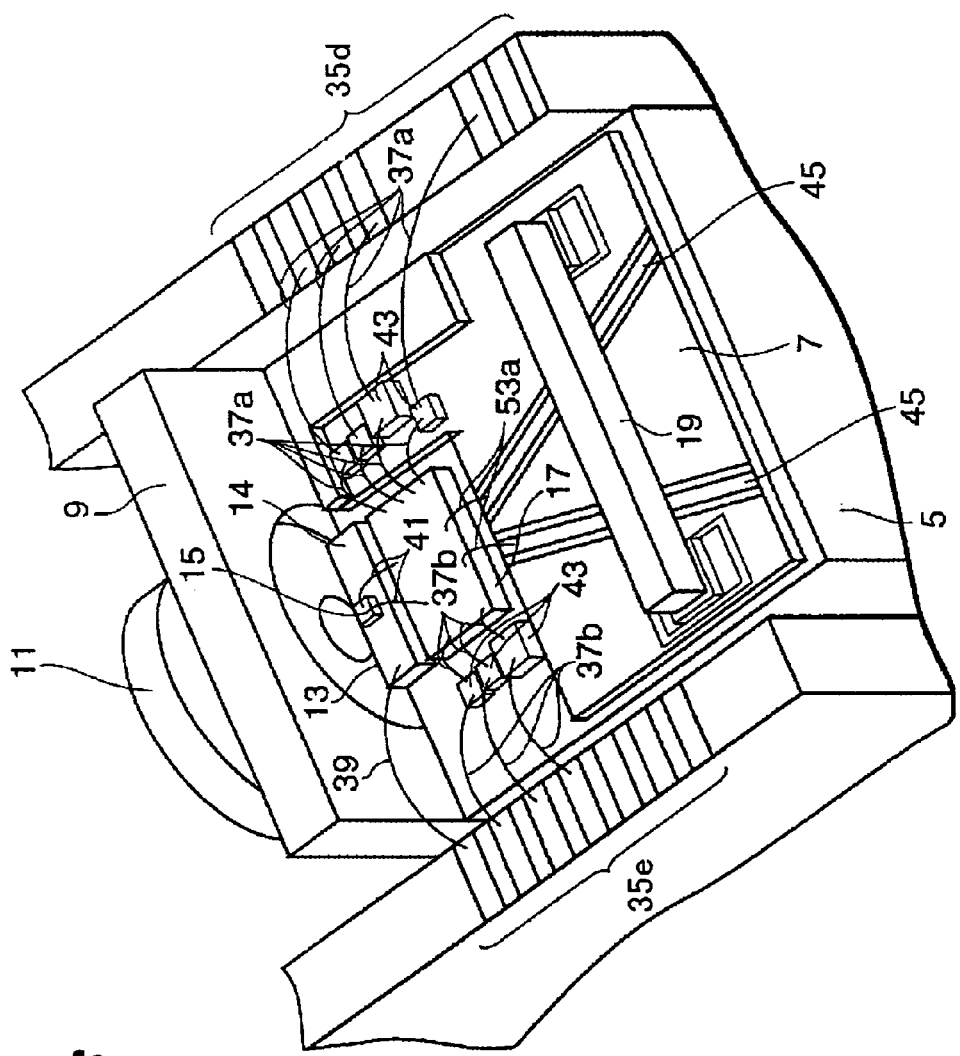
FIG. 6 is an expanded view showing the primary portion in FIG. 1.

FIG. 6 is a perspective expanded view of a primary portion of the light-transmitting module shown in FIG. 1. Next, an electrical configuration of the module 1 will be described as referring to FIG. 6.

The conductive layer 14 on the heat sink 13 is electrically connected to the wiring pattern 35e via a bonding wire 39, namely, the anode electrode 151 of the laser diode 15 is connected to the lead terminal 35b via the conductive layer 14, the bonding wire 39 and the wiring pattern 35e. The first block 5 is electrically connected to one of wiring patterns from 35d to 35f with a bonding wire, which is not shown in FIG. 6, whereby one of lead terminal from 35a to 35c connected to the relevant wiring pattern is grounded in the outside of the module 1.

The cathode electrode 157 of the laser diode 15 is connected to the driver 17 via bonding wires 41. The plurality of bonding wires 37a and 37b connects the driver 17 to the corresponding wiring patterns 35d and 35e to provide biases from the outside of the module 1. The halfway of the bonding wires 37a and 37b are coupled to one electrode of respective capacitors 43, namely, die-capacitor having parallel plate like structure. Another electrode of the capacitors faces and is in contact with the first block 5 and the substrate 7.

Further, two bonding wires 53a connects the driver 17 to the wiring patterns 45 on the substrate 7 to provide the driving signal to the driver 17. These wiring patterns 45 are connected to another wiring pattern 35f via bonding wires 53b as shown in FIG. 2.

The lead terminals 35a, 35b and 35c, they are electrically connected to a control circuit provided outside of the light-transmitting module 1, supply biases and driving signals to the driver 17. The photodiode 21 is also connected one of wiring patterns from 35d to 35f.

Thus configured light-transmitting module 1 operates as follows. The conductive layer 14 is supplied a bias from the lead terminal 35b via the bonding wire 39. Since the conductive layer 14 is one electrode of the parasitic capacitor 16 or 16a, the bias may be stabilized. While, the wiring pattern 45 provides the driving signal to the driver, and thus provided driving signal is re-shaped, and amplified in the driver.

The photodiode 21 monitors the amplitude of the light emitted from the laser diode 15. The driver 17 supplies the driving current to the laser diode 15 such that the amplitude of the light monitored by the photodiode 21 is set to a predetermined value. The driving current is modulated by the driving signal. Thus, the driving current is provided between the anode 151 and the cathode electrodes 157 of the laser diode 15, and coherent light is generated in the active layer 154. The light is emitted from the light-emitting facet 15a, and enters the optical fiber 3a via two lenses 47 and 27a.

Figure 7A:
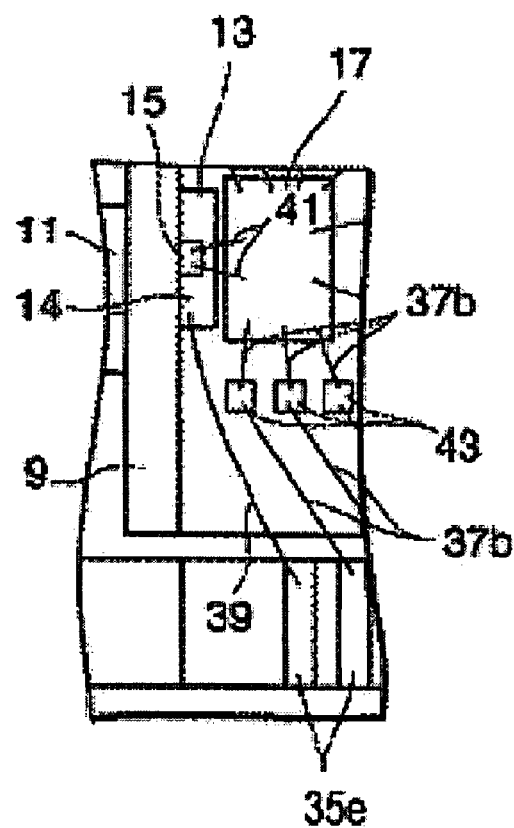
FIG. 7A is a plan view showing the wiring from the lead terminal to the laser diode.
Figure 7B:
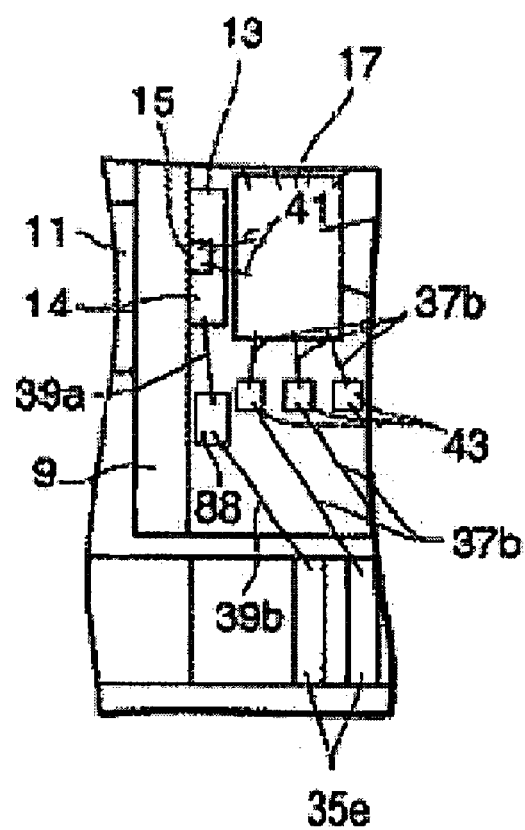
FIG. 7B is a plan view showing the wiring of another example.

Next, the function of the capacitance according to the present invention will be described. FIG. 7A is a plan view showing a portion from the laser diode 15 to the wiring pattern 35e. FIG. 7B shows the same portion as that in FIG. 7A for another configuration. FIG. 8A and FIG. 8B show electrical connection corresponding to configurations of FIG. 7A and FIG. 7B, respectively.

In FIG. 7A, the conductive layer 14 of the heat sink 13 connected to the wiring pattern 35e via the bonding wire 39. A fine and long conductor such as bonding wire functions as an inductor. Therefore, as shown in FIG. 8A, the bonding wire 39 operates as an inductor L11. The wiring pattern 35e is connected to the bias V11 via the lead terminal 35b. On the other hand, the heat sink 13 is in contact with the first block 5, which is grounded. The bias voltage to the laser diode 15 is stabilized with the capacitance 16 formed by the first block 5, the heat sink 13 and the conductive layer 14. The cathode electrode 157 of the laser diode is connected to the driver 17 via the bonding wire 41, which also operates as an inductor L12. Thus, not only the bias voltage, for example +5V, is supplied to but also the driving current Id is applied to the cathode electrode 157 of the laser diode 15 via the bonding wire 41.

In another embodiment of FIG. 7B and FIG. 8B, the conductive layer 58a of the heat sink 58 is connected to the upper terminal of the die-capacitor 88 via the bonding wire 40a. The upper terminal is connected to the wiring pattern 35e via the bonding wire 40b. Each bonding wire 40a and 40b operates as an inductance L21 and L22, respectively. The wiring pattern 35e is connected to the bias voltage V11. The lower terminal of the die-capacitor 88 is grounded via the first block 5. The heat sink 58 of this embodiment is made of aluminum nitride (AlN). The cathode electrode 157 of the laser diode 15 is, similar to the case of FIG. 8A, connected to the driver 17 via the bonding wire 41. Thus, the bias voltage, for example of +5 V, is supplied to the anode electrode 151 via the wiring pattern 35e, the bonding wires 40a and 40b, and the conductive layer 58a. Simultaneously, the driving current Id is applied to the cathode electrode 157 from the driver 17.

Figure 9A:
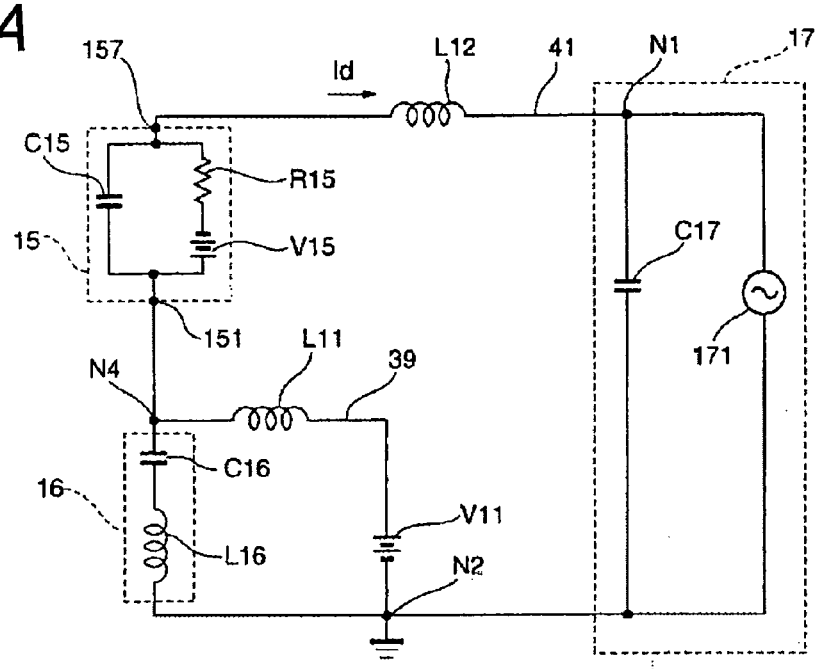
FIG. 9A is a circuit diagram of FIG. 8A.
Figure 9B:
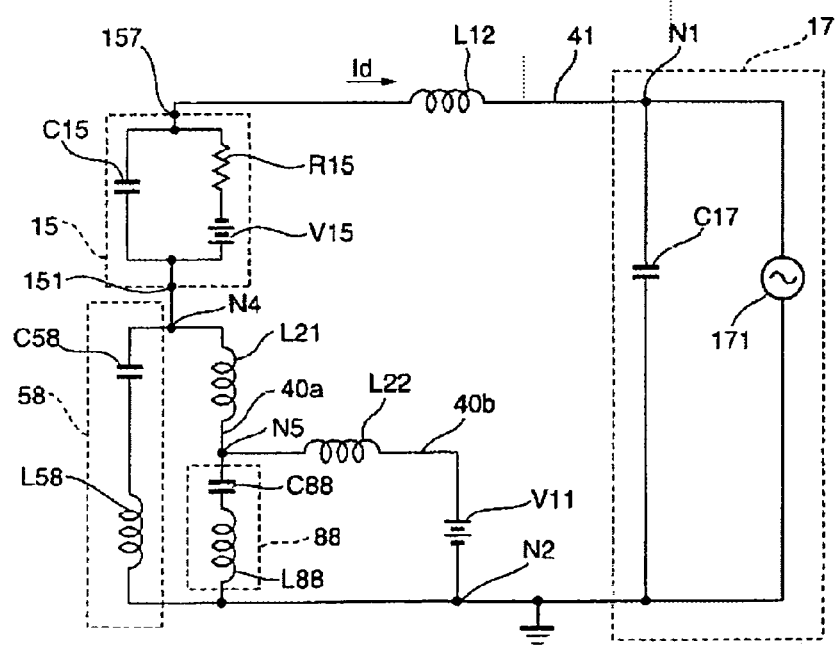
FIG. 9B is a circuit diagram of FIG. 8B.
Figure 10A:
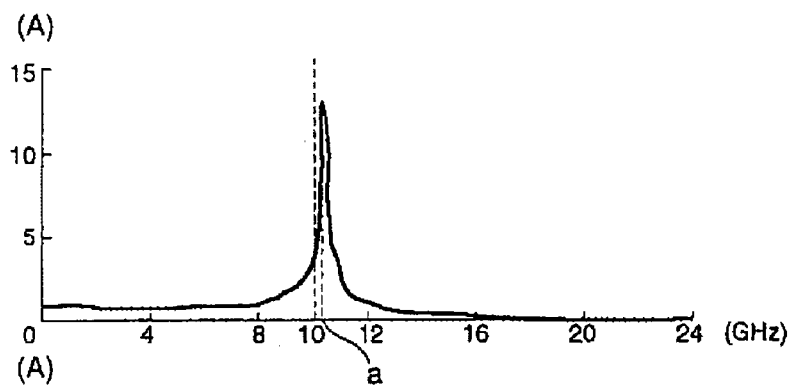
Figure 10B:
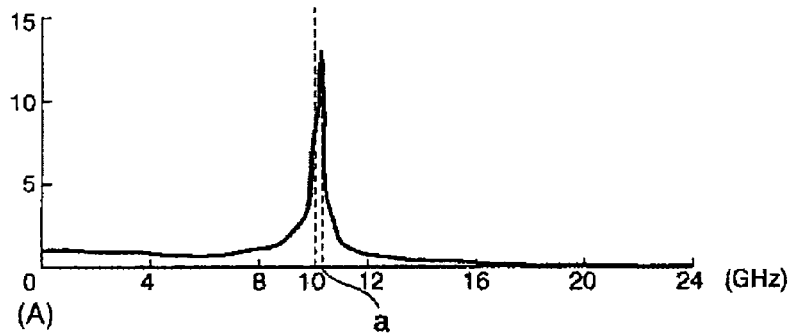
Figure 10C:
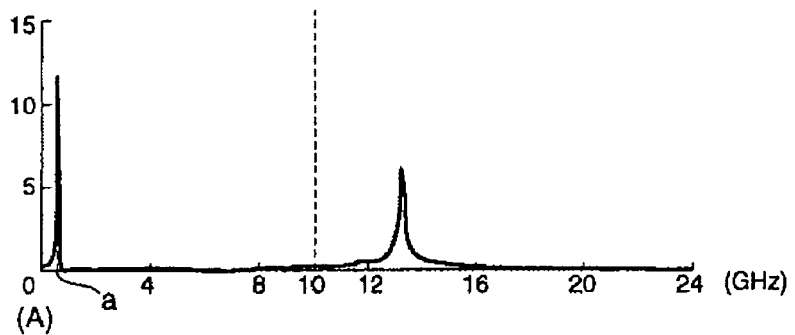
Figure 10D:
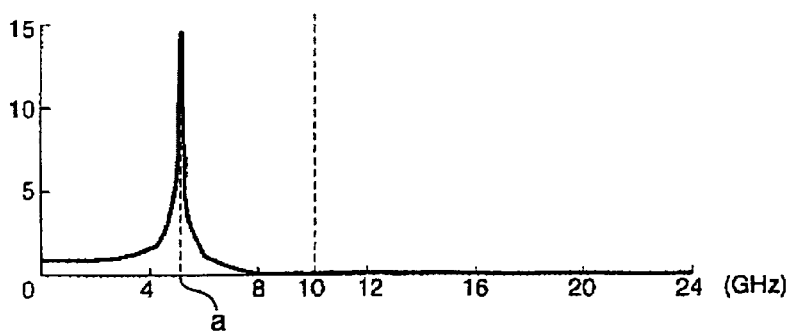

FIG. 9A and FIG. 9B show circuit diagrams of the configuration shown in FIG. 8A and FIG. 8B, respectively. In FIG. 9, the driver 17 has a signal source with an output capacitance C17 between the node N1 and the node N2. The node N2 is grounded. The bonding wire having the parasitic inductance L12 is connected between the node N1 and the cathode electrode 157 of the laser diode 15. The equivalent circuit of the laser diode 15 has a junction capacitance C15 and a serially connected voltage source V15 and a resistance R15. The anode electrode 151 of the laser diode 15 is connected to the node N4.

FIG. 9B is an equivalent circuit of another configuration shown in FIG. 8B. In FIG. 9B, the node N4, which is the conductive layer 58a, and the node N5, the upper electrode of the die-capacitor 88, are connected by the bonding wire 88. In a closed loop of the bonding wire 40a, the die-capacitor 88, the driver 17 and the laser diode 15, the inductance L12, L21, L88 and the capacitance C88 define a critical frequency of the loop. When this critical frequency closes to the resonant frequency of the laser diode 15, the operation of the laser diode 15 becomes unstable.

In the present light-emitting module 1, a closed loop of the parasitic capacitor C16, the driver 17 and the laser diode 15 has a critical frequency determined by the inductance L12, L16 and the capacitance C16. In the present module 1, since the laser driver 15 is mounted on the capacitor formed by the first block 5, the heat sink and the conductive layer 14, the bonding wire 40a in FIG. 9B is not necessary. Therefore, the critical frequency of the present module 1 shifts to higher frequency because the inductance L21 is omitted.

The die-capacitor 88 is unnecessary in the present module because the laser diode 15 is mounted on the capacitor 16 and 16a, which also omits the bonding wire from the die-capacitor 88 to the laser diode 15. Therefore, the influence of the inductor L21 can be removed and the high frequency performance of the module can be enhanced.

One typical example shown in FIG. 9A and FIG. 9B is that L11, L12, L88, C15, C16, C17, C58, C88, V11, V15 and R15 are 50 nH, 0.3 nH, 0.07 nH, 8.5 pF, 80 pF, 0.7 pF, 0.1 pF, 220 pF (the die-capacitor 88 is optional in its capacitance), +5 V, +12 V and 55 Ω, respectively.

When the light-emitting module is operated at 10 Gbps maximum, the critical frequency of the circuit to drive the laser diode 15 is preferably greater than 10 GHz. From FIG. 10A to FIG. 10d show operations of the driving circuit when the capacitor 16 is 1000 pF (FIG. 10A), 50 pF (FIG. 10B), 1 pF (FIG. 10C), and 0 pF (FIG. 10D), respectively. When the capacitance of the capacitor 16 is 1000 pF or 50 pF, the critical frequency of the circuit 10 is over 10 GHz. On the other hand, the capacitance is 1 pF, or no capacitor is connected, the critical frequency is below 10 GHz. Therefore, at least of 50 pF for the capacitance of the capacitor 16, the circuit can be configured such that the critical frequency thereof does not affect the operation of the laser diode 15 when the optical signal over 10 Gbps is obtained from the light-emitting module 1.

FIG. 11 shows another configuration of the laser diode 15 and the heat sink 13. In this embodiment, a second conductive layer 20 is provided between the heat sink 13 and the insulating layer 18. The capacitor 16b is formed by a stacking of two conductive layers 14 and 20 and an insulating layer sandwiched by two conductive layers, which forms a parallel plate structure. When the size of the conductive layers 14 and 20 is 0.5 mm square, and the thickness of the insulating layer 18 is about 0.35 mm, a capacitor 16b having relatively large capacitor, for example 220 pF and 1000 pF, can be formed on the heat sink 13.

Second Embodiment

Next, the second embodiment of the present invention will be described in detail. A light-emitting module 2 according to the second embodiment has a passive alignment arrangement. FIG. 12 is a perspective view, FIG. 13A is a cross sectional view taken along the line I-I in FIG. 12, FIG. 13B is a plan view, and FIG. 13C is a cross sectional view taken along the line II-II.

The light-emitting module 2 has a lead frame 75, a heat sink 61, a sub-mount 63, a driver 65, a plurality of lead terminals from 79a to 79d, and an optical fiber 71. The sub-mount 63 mounts the driver 65 thereon. The optical fiber 71 is secured by a ferrule 73, which is also mounted on the heat sink 61. A resin 77 molds the light-emitting module 2.

On the lead frame 75 is mounted the sub-mount 63. The heat sink 61 made of conductive material such as copper tungsten (CuW) has receiving regions for the ferrule 61e, the optical fiber 61d and the laser diode 61a, formed integrally thereon and arranged along the reference axis 76 in this order. The level of the receiving region 61a for the laser diode 15 is below that 61d for the optical fiber 71. Between two regions for the optical fiber 61d and for the ferrule 61e is formed a groove 61h extending along a direction across the reference axis 76.

On the region 61a for the laser diode is formed a stacking of an insulating layer made of silicon oxide ($SiO_2$) 61b and a conductive layer of evaporated gold (Au) 61c. These layers of the heat sink 61a, the insulating layer 61b and the conductive layer 61c functions as a capacitor 70. The laser diode 67 is mounted on the conductive layer. The structure of the laser diode 67 is same as the laser diode 15 previously shown in FIG. 6. The region 61d for the optical fiber 71 has a V-groove 61f extending along the reference axis 76. Setting the optical fiber 71 into the V-groove 61f, the light-emitting facet 57a of the laser diode 67 is passively aligned to the tip of the optical fiber 71.

The region 61e for the ferrule has another V-groove 61g, a width of which is greater than the V-groove in the region 61d, is formed in the region 61e for the ferrule. The ferrule is secured within the groove such that the edge surface thereof is abutted on the sidewall of the groove 61h, thereby defining the position of the ferrule 73 along the reference axis 76.

The driver 65 mounted on the sub-mount 63 has terminal to be connected to the cathode of the laser diode 67 via bonding wires 81. Another terminal of the driver 65 is connected to lead terminals 79a and 79b via bonding wires 85. The conductive layer 61c of the region 61a is connected to another lead terminal 79d via the bonding wire 83. The lead terminals from 79a to 79d extend perpendicular to the reference axis 76. Only the lead terminal 79c is extended from the island 75a of the lead frame 75, other lead terminals 79a and 79b are isolated from and disposed aside the island 75a.

FIG. 14 shows an outside appearance of the light-emitting module 2. The module 2 shown in FIG. 12 is fully molded with resin 77 with a primary portion 77d and a head portion 77e. The primary portion 77d disposes lead terminals, from 79b to 79d in both sides thereof, 77a and 77b. On the front surface 77c of the head portion 77e is projected the ferrule 73, and the both sides, 77f and 77g, of the head portion 77e provide a fitting mechanism 77h and 77i to mate the module 2 with the optical connector.

The light-emitting module thus configured operates as follows. One of the lead terminals 79b, which is connected to the conductive layer 61c via the bonding wire 83, shown in FIG. 12, is supplied the bias voltage. Since the conductive layer 61c functions as one electrode of the capacitor 70, the supplied bias voltage can be stabilized by the capacitor 70. The driving signal is also supplied from the outside via the lead terminal 79a or 79b. The driver 65 provides the driving current, which is the bias voltage modulated by the driving signal, to the laser diode 67, whereby the laser diode 67 generates coherent light corresponding to the driving signal. The coherent light thus generated is emitted from the light-emitting facet 67a and enters the optical fiber 71.

In the module 2, since the laser diode 67. shown in FIG. 12, is mounted on the capacitor 70, similar to the module 1 in the first embodiment, a bonding wire connecting the laser diode to the capacitor can be omitted, thereby enhancing the high frequency performance of the module by eliminating the parasitic inductance due to the bonding wire.

Further, since the light-emitting module 2 has the V-groove 61f, into which the optical fiber 71 is secured, the optical alignment between the light-emitting facet 67a of the laser diode 67 and the tip of the optical fiber 71 can be performed without difficulty.

The light-emitting module according to the present invention is not restricted to embodiments thus described with accompanying drawings, and various modifications may be considered. The heat sink is not restricted to those materials shown in the description, various insulating materials may be applicable, and various metal without gold may be used for the conductive layer.

What is claimed is:

1. A light-transmitting module, comprising:
    a stack of a metallic block, an insulating heat sink mounted on said metallic block and an electrically conductive layer formed on said insulating heat sink, said stack forming a parallel-plate capacitor with capacitance;
    a laser diode having an anode and a cathode, said laser diode being mounted on said conductive layer such that said anode faces and is in contact with said conductive layer, said laser diode being driven by a driver signal provided by said cathode and being biased in said anode through said conductive layer and a bonding wire with inductance, said bonding wire being connected with said conductive layer; and
    a driver for providing said driver signal to said cathode of said laser diode, said driver being directly mounted on a metallic block,
    wherein a said capacitance of said parallel-plate capacitor is at least 50 pF such that a critical frequency formed by said parallel-plate capacitor and said inductance of said bonding wire exceeds 10 GHz.

2. The light-transmitting module according to claim 1, wherein said laser diode includes an n-type substrate and a plurality of epitaxial layers of an n-type cladding layer, an active layer, and a p-type cladding layer grown on said n-type substrate, said p-type cladding layer corresponding to said anode and said n-type substrate corresponding to said cathode, said laser diode being mounted on said conductive layer such that said plurality of epitaxial layers faces and is in contact with said conductive layer.

3. The light-transmitting module according to claim 1, wherein said laser diode includes a p-type substrate and a plurality of epitaxial layers of a p-type cladding layer, an active layer, and an n-type cladding layer grown on said p-type substrate, said n-type cladding layer corresponding to said cathode and said p-type substrate corresponding to said anode, said laser diode being mounted on said conductive layer such that said p-type substrate faces and is in contact with said conductive layer.

4. A light-transmitting module, comprising:

a stack of an electrically conductive heat sink, an insulating layer provided on said heat sink and an electrically conductive layer, said stack forming a parallel-plate capacitor with capacitance;

a laser diode having an anode and a cathode, said laser diode being mounted on said electrically conductive layer such that said anode faces and is in contact with said conductive layer, said laser diode being driven by a driver signal provided by said cathode and being biased in said anode through said conductive layer and a bonding wire with inductance, said bonding wire being connected with said conductive layer; and a driver for providing said driver signal to said cathode of said laser diode, said driver being directly mounted on a metallic block, wherein a said capacitance of said parallel-plate capacitor is at least 50 pF such that a critical frequency formed by said parallel-plate capacitor and said inductance of said bonding wire exceeds 10 GHz.

5. The light-transmitting module according to claim 4, wherein said laser diode includes a p-type substrate and a plurality of epitaxial layers of a p-type cladding layer, an active layer, and an n-type cladding layer grown on said p-type substrate, said n-type cladding layer corresponding to said cathode and said p-type substrate corresponding to said anode, said laser diode being mounted on said conductive layer such that said p-type substrate faces and is in contact with said conductive layer.

6. The light-transmitting module according to claim 4, wherein said heat sink is made of copper tungsten.

7. The light-transmitting module according to claim 4, wherein said heat sink is made of silicon.

8. The light-transmitting module according to claim 4, wherein said insulating layer is made of material selected from a group of silicon oxide, silicon nitride, or silicon oxi-nitride.

9. The light-transmitting module according to claim 4, further comprising an electrically conductive and grounded block, said heat sink being mounted on said conductive block.

10. The light-transmitting module according to claim 4, wherein said laser diode includes an n-type substrate and a plurality of epitaxial layers of an n-type cladding layer, an active layer, and a p-type cladding layer grown on said n-type substrate, said p-type cladding layer corresponding to said anode and said n-type substrate corresponding to said cathode, said laser diode being mounted on said conductive layer such that said epitaxial layers face and are in contact with said conductive layer.

11. A light-transmitting module, comprising:

a stack of an electrically conductive heat sink, an insulating layer provided on said heat sink and an electrically conductive layer, said stack forming a parallel-plate capacitor with capacitance;

a laser diode having an anode and a cathode, said laser diode being mounted on said electrically conductive layer such that said anode faces and is in contact with said conductive layer, said laser diode being driven by a driver signal provided by said cathode and being biased in said anode through said electrically conductive layer and a bonding wire with inductance, said bonding wire being connected with said electrically conductive layer;

an electrically conductive and grounded block for mounting said stack; and a driver for providing said driver signal to said cathode of said laser diode, said driver being directly mounted on said electrically conductive block, wherein said capacitance of said parallel-plate capacitor is at least 50 pF such that a critical frequency formed by said parallel-plate capacitor and said inductance of said bonding wire exceeds 10 GHz.

* * * * *